United States Patent [19]

Sjardijn et al.

[11] Patent Number: 5,180,867
[45] Date of Patent: * Jan. 19, 1993

[54] COPOLYMERIZATION OF DICYCLOPENTADIENE WITH NORBORNENE DERIVATIVES

[75] Inventors: Willem Sjardijn; Johannes J. M. Snel, both of Amsterdam, Netherlands

[73] Assignee: Shell Oil Company, Houston, Tex.

[*] Notice: The portion of the term of this patent subsequent to Mar. 3, 2009 has been disclaimed.

[21] Appl. No.: 438,148

[22] Filed: Nov. 20, 1989

[30] Foreign Application Priority Data

Nov. 22, 1988 [GB] United Kingdom ............... 8827264

[51] Int. Cl.$^5$ ............................................. C07C 13/61
[52] U.S. Cl. ...................................... 585/22; 526/283; 526/166; 526/128; 526/142
[58] Field of Search ........................... 526/126; 585/22

[56] References Cited

U.S. PATENT DOCUMENTS 3,718,474  2/1973  Kolb et al. .................... 96/115 P
4,568,660  2/1986  Klosiewicz ................... 502/169
4,762,092  8/1988  Yuasa et al. .................. 585/22

FOREIGN PATENT DOCUMENTS 142861   5/1985  European Pat. Off. .
181640  11/1985  European Pat. Off. .
61-293208 of 0000  Japan .

OTHER PUBLICATIONS

Carl R. Noller, Chemistry of Organic Compounds, 3rd edition, 1965, W. B. Saunders Company.

Primary Examiner—Joseph L. Schofer
Assistant Examiner—Wu C. Cheng

[57] ABSTRACT

A process for the production of thermoset copolymers having tailored product properties such as high glass transition temperature and/or increased cross-linking, the process comprising contacting a comonomer mixture with a methathesis catalyst system obtainable by combining at least a catalyst component and an activator component, wherein the comonomer is selected from compounds according to the formulae:

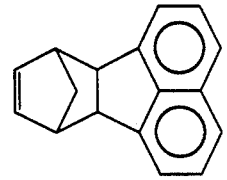

A

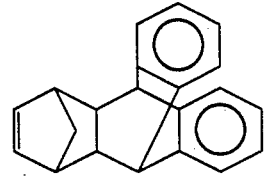

B

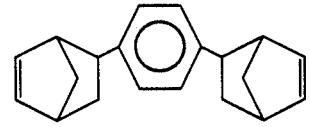

C

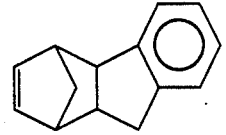

D

4 Claims, No Drawings

COPOLYMERIZATION OF DICYCLOPENTADIENE WITH NORBORNENE DERIVATIVES

BACKGROUND OF THE INVENTION

This invention relates to the copolymerization of dicyclopentadiene with norbornene derivatives and to copolymers obtainable thereby. In one aspect, the invention relates to the copolymerization of dicyclopentadiene with bulky norbornene monomers to provide copolymers showing tailored product properties such as increased glass-transition temperatures.

Processes for copolymerization of dicyclopentadiene with relatively bulky norbornene monomers by ring-opening polymerization are known from, e.g., Japanese patent application No. 61293208, U.S. Pat. No. 4,568,660, U.S. Pat. No. 3,718,474 and European patent No. 142,861.

Japanese patent application No. 61293208 discloses production of a copolymer by ring opening and copolymerization by a reaction injection moulding (RIM) process of at least two norbornene type monomers in the presence of a catalyst containing an inorganic tungsten compound and an activator to form a molded copolymer showing acceptable thermal resistance. Particularly disclosed comonomers are, e.g., tetracyclododecene, methyltetracyclododecene, dimethyltetracyclododecene, ethyltetracyclododecene and propyltetracyclododecene, and preferably at least one of 2-norbornenes and dicyclopentadiene and at least one tetracyclododecene are used in a ratio of 5-8% by weight and 20-95% by weight, respectively, for a copolymerization using a tungsten compound such as $WCl_6$ or $WOCl_4$ and an activator such as a dialkylaluminium monohalide, an aluminium sesquihalide, a trialkylaluminium and/or an aluminum trihalide as metathesis catalyst system.

U.S. Pat. No. 4,568,660 discloses, in column 32, lines 58-68 and in column 33, lines 1-32, respectively, the addition of a comonomer that will either have two or more strained, reactive double bonds that will open during the polymerization, in order to increase the number of crosslinks, or a comonomer which contains four or more rings so that rotation or movement of the resulting backbone will be more constrained, in order to reach a raised Tg of the polymer. As examples of useful norbornene type monomers are mentioned 1:1 Diels-Alder adducts of cyclopentadiene with norbornene, norbornadiene and 1,5-cyclooctadiene, the adducts of cyclopentadiene with polyfunctional acrylates such as trimethylolpropane triacrylate and the like, and the 2:1 adduct of cyclopentadiene with diallyl adipate. Substantial increases in the crosslink density (as measured by the degree of swelling of the copolymers) are reported with copolymers made from dicyclopentadiene (DCPD) and the cyclopentadiene adducts with norbornadiene, trimethylpropane triacrylate, ethylene glycol diacrylate and ethylene glycol dimethacrylate.

U.S. Pat. No. 3,718,474 at column 4, lines 52-58, discloses the preparation of a copolymer of DCPD and acenaphthylene to be used in an exposure assembly for imagewise exposing of a layer of a solid soluble polymer that becomes crosslinked to an insoluble condition at sites of exposure to light.

European patent No. 142,861 discloses a RIM method for making a crosslinked thermoset polymer containing units derived from DCPD, catalyzed by a metathesis catalyst system which includes an organoaluminium or alkylaluminium halide activator. In this method, not more than 20% of the DCPD units are replaced by other polymerizable units and the catalyst is a pentavalent tantalum catalyst represented by the formula $Ta—Y_5$, wherein $—Y$ is a) a halide, b) an alkoxy having the formula $—O—R$ in which the organic radical R is a hydrocarbyl containing from 1 to 10 carbon atoms, c) an aryloxy having the formula $—O—Ar$, wherein the radical Ar is an aromatic radical containing from 1 to 3 aromatic rings, or d) an acyloxy having the formula $OOCR^1$, in which the organic radical $R^1$ is a hydrocarbyl containing from 1 to 10 carbon atoms. The other cycloolefin monomers are selected from norbornene, norbornadiene, cyclopentene, dimethanehexahydronaphthalene and dimethaneoctahydronaphthalene.

There remains a need for an economical process for the manufacture of crosslinked thermoset polymers based on DCPD having tailored product properties, such as higher glass transition temperatures.

It is therefore an object of the invention to provide an improved process for preparing DCPD-based polymers.

BRIEF SUMMARY OF THE INVENTION

The copolymerization of dicyclopentadiene and bulky comonomers is accomplished in a process comprising contacting a monomer mixture with a ring-opening metathesis catalyst system obtainable by combining at least a catalyst component and an activator component, wherein the comonomer is one or more compounds according to the formulae:

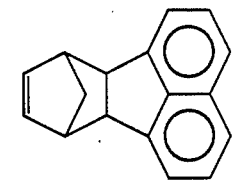

A

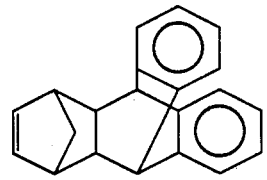

B

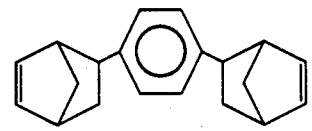

C

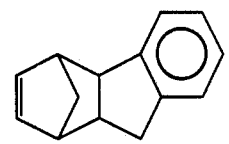

D

DETAILED DESCRIPTION OF THE INVENTION

The above-identified comonomers may occur in principle in two isomeric forms, e.g., the endo and exo form, or mixtures thereof, all of which may be included in the monomer mixture to be polymerized into thermoset polymers.

The copolymerization of DCPD and the specified comonomers A, B, C and D may in general be carried out using mixtures containing 5-25% by weight of one or more of these specified monomers, preferably 10-20% by weight, calculated on the weight of the DCPD.

The incorporation of the above-described comonomers in the polydicyclopentadiene permits the production of themoset copolymers having tailored product properties, particularly a predetermined increase of the glass transition temperature and/or degree of crosslinking, depending on the final use of the copolymers, by varying the initial comonomer concentration and/or comonomer type.

In addition to the above-described comonomers A, B, C and D, one or more other non-bulky comonomers, such as norbornene for example, structurally more closely related to DCPD may be included in the starting monomer composition.

An advantage of the present process when using the preferred catalyst composition containing a tin compound as activator, is the use of unpurified comonomers A, B, C and D.

The comonomers A, B, C and D are novel compounds, which form another feature of the present invention.

The above-described specified comonomers A, B, C and D may be prepared by methods known per se, starting in general from DCPD and a dienophile. More particularly the comonomer A may be prepared via a Diels-Alder addition by reacting DCPD, acenanaphthalene and hydroquinone under heating, while the starting acenanaphthalene is a generally available commercial product.

The comonomer B may be prepared by Diels-Alder addition of norbornadiene and anthracene under heating in a nitrogen atmosphere, as disclosed in, for example, the Journal of the American Chemical Society 102:2, January 1980, p. 674.

The comonomer C may be prepared by Diels-Alder addition of DCPD and divinylbenzene according to a method similar to the preparation of the DCPD and styrene adduct described in J. Org. Chem. Vol 38, No. 24, 1973. The comonomer D may be prepared by Diels-Alder addition of DCPD and indene.

The tungsten halide to be used for the preparation of the catalyst component may be a bromide or a fluoride, but is preferably a chloride and more preferably tungsten hexachloride. Another example of a tungsten chloride is tungstenoxy tetrachloride ($WOCl_4$).

Preferably, the copolymerization process is carried out by using as catalyst component a tungsten compound obtainable by combining a tungsten halide with a phenol derivative and as activator component an organic tin compound and/or a silicon compound, containing at least one hydrogen atom bound to the tin atom and/or the silicon atom.

In general the phenol could be substituted with a bulky alkyl group at the positions ortho with respect to the hydroxyl group. On the other side, the phenol may be a monocyclic halophenol in which the halogen atoms are attached to the aromatic nucleus. Among the halophenols, fluorophenols are preferred, but chlorophenols and bromophenols may be used. Very high reaction rates are obtained when polyfluorophenols are used. The highest rates of polymerization are obtained when the polyfluorophenol carries four or five fluorine atoms. Examples of such phenols are 2,3,4,5-tetrafluorophenol, 2,4,5,6-tetrafluorophenol and 2,3,5,6-tetrafluorophenol. Very good results have been obtained with 2,3,5,6-tetrafluorophenol and pentafluorophenol. An advantage of the use of such very active catalytic systems is that only very little thereof need be used.

Very high polymerization rates are obtained when the phenol is a monocyclic phenol having a trihalomethyl substituent attached to the aromatic nucleus. The trihalomethyl substituent is preferably a trifluoromethyl group, but may be a trichloromethyl or tribromomethyl group. Very good results have been obtained with 3-trifluoromethylphenol. Other examples of such phenols are 2-trichloromethylphenol, 4-trifluoromethylphenol, 2-trifluoromethylphenol, 3-chlorodifluoromethylphenol, 3-dichlorofluoromethylphenol and 3-tribromomethylphenol.

According to a preferred embodiment of the present invention, the catalytic system is the product of combining the following two components:

(1) a tungsten compound obtainable by combining a tungsten halide with a para-trihalomethylphenol, the phenyl nucleus optionally being substituted by an alkyl group or halogen atom, and (2) a compound of the formula:

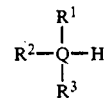

wherein Q represents Sn or Si, in which $R^1$ and $R^2$ may each represent hydrogen, and in which $R^1$, $R^2$ and $R^3$ may represent an optionally substituted alkyl group of from 1 to 20 carbon atoms, an optionally substituted cycloalkyl group having in the range of from 3 to 6 carbon atoms in the cycloalkyl ring or an optionally substituted phenyl group.

Component 1 may be prepared in the presence of a suitable solvent. Examples of such solvents are cyclopentane, cyclohexane, benzene, toluene, o-, m- and p-xylene, chlorobenzene and 1,2-dichlorobenzene.

However, according to a preferred embodiment, component 1 is dissolved in a mixture of DCPD and the comonomer(s) as solvent.

Suitably, a molar ratio of phenol to tungsten in the range of from about 1:1 to 10:1, preferably 3:2 to 3:1 is used. The preparation of component 1 may take place by suspending a tungsten halide in the solvent and adding the phenol to the suspension formed, stirring the reaction mixture, and blowing a stream of a dry inert gas, for example nitrogen, through the mixture to remove the hydrogen halide.

Component 2 is preferably a tin compound of the general formula I in which $R^1$, $R^2$ and $R^3$ each represent an alkyl group having in the range of from 1 to 10 and, in particular, 2 to 4 carbon atoms or phenyl, when Q represents tin, whereas at least two of the symbols represent alkyl or phenyl, when Q represents silicon. Examples of suitable tin compounds are tripropyltinhydride, tripentyltinhydride, tributyltinhydride, methyldicyclohexyltinhydride, cyclopentyldimethyltinhydride, trioctyltinhydride, triphenyltinhydride and phenyldimethyltinhydride, of which tributyltinhydride is preferred. Examples of suitable silicon compounds are dibutylsilane, triethylsilane, trihexylsilane, dipropylsilane, dipentylsilane, diphenylsilane, dicyclohexylsilane, dicyclopentylsilane and dioctylsilane. Examples of substituents in $R^1$, $R^2$ and $R^3$ are alkoxy groups having in the range of from 1 to 20 carbon atoms and chlorine and fluorine atoms.

The process of the invention can be carried out at a molar ratio of tungsten to dicyclopentadiene monomer and a molar ratio of tin and/or silicon compound of the general formula I to tungsten which are not critical and may vary within wide ranges. Preferably, the former ratio is in the range of from about 1:20,000 to 1:100, preferably about 1:1,000 to 1:10,000, and the latter ratio is in the range of from about 15:1 to 1:1, preferably about 12:1 to 3:1.

In a more advantageous embodiment of the process, a technical grade of dicyclopentadiene, which may contain impurities distilling below a top temperature of 100° C. at a pressure of 12,400±400 Pa, may be used in the comonomer composition. Such impurities usually form azeotropic mixtures with dicyclopentadiene. The technical grade may contain, for example, at least 83% by weight of pure dicyclopentadiene. An advantage of the use of such technical grades is that they are usually liquid at ambient temperature, say at 20° C.; pure endo-dicyclopentadiene has a melting point of 32° C. Commercially, dicyclopentadiene is usually available in the endo form, but, if desired, the exo form may be used, or mixtures of the endo and exo form. The technical grade of DCPD is preferably obtained by dimerization of a technical grade of cyclopentadiene, which, in turn, is obtained by fractional distillation of the products obtained by cracking of hydrocarbons, for example a naphtha fraction, in the presence of steam.

Generally, the polymerization takes place in bulk, but components 1 and 2 may be dissolved in a small amount of solvent, such as toluene. It is preferred to use, however, DCPD as a solvent for at least one of the two components. For the tin compound no solvent at all may also suffice, since the tin compound is usually a liquid at ambient temperature.

A preferred method for the polymerization of the monomer mixture is to allow contact between a stream of component 1 and a stream of component 2, whereby at least one of the streams has been admixed with the comonomer mixture or DCPD prior to the polymerization, and to polymerize the comonomers. For example, it is possible to dissolve component 1 in the monomer mixture or DCPD and either to dissolve component 2 in the monomer mixture or DCPD or in another solvent or to use the activator without any solvent. After both streams have contacted with each other, the resulting mixture is preferably injected or poured into a mold where polymerization of the monomer mixture takes place.

Component 1 and component 2 may be stored in DCPD for some time, provided that the DCPD contains not more than a few parts per million (ppm) by weight of water. Component 2 is storable in DCPD for one to two months without loosing its activity. These stock solutions are preferably mixed with the desired predetermined amount of selected monomer(s). The reaction mixture components or streams may also include an additional solvent.

It will be appreciated that starting reaction mixtures or components thereof, comprising at least one of the monomers A, B, C or D, the catalyst component (1) or (2) and optionally DCPD and/or another solvent, also form an aspect of the present invention.

The process according to the present invention may be carried out in the presence of auxiliary materials, for example fillers, fibres, anti-oxidants, tougheners, stabilizers, pigments and plasticizers.

The catalytic system used in the process is specifically of interest for reaction injection molding or casting. Because of the low viscosity of the monomers/catalyst system mixture, the polymerization is very suitable for large castings with intricate molds. The process is usually carried out at an average polymerization temperature in the range of from 50° C. to 200° C. It is a favorable feature of the present invention that the components 1 and 2 of the catalytic system are very stable.

A further advantage of the process of the present invention resides in the fact that the thermoset polymer obtained by the process need not be subjected to a heat-treatment at a temperature in the range of from 200° C. to 300° C. for times of an hour or more, in order to increase the glass transition temperature of the polymer from a starting value of 125° C. to 160° C., which renders the polymer more useful, and saves energy costs.

The process according to the invention allows quantitative polymerization, the final polymer being free from starting monomers and more particularly DCPD. For this reason the thermoset polymer is free from odor and can be used for a large number of applications such as structural composites, for example in the automotive industry, and application in the electrical industry, for example in printed circuit boards.

The following examples illustrate specific embodiments of the invention.

In all copolymerization experiments a technical grade of DCPD was used, which contained:
3.5% isopropenyl-2-norbornene,
1.1% 5-cis and trans-1-propenyl-2-norbornene,
0.7% 5-methyl tetrahydroindene, and
70 ppm water.
This DCPD was dried until it contained less than 1 ppm water.

EXAMPLE 1 a) Synthesis of 5,6-acenaphthene-norbornene (comonomer A)

A mixture of 97 g of DCPD (0.73 mol), 112 g of acenaphthylene (0.66 mol) and 4 g of hydroquinone was heated at 140°-150° C. for 20 hours, and the resulting mixture was cooled and filtrated. The remaining solution was distilled in vacuo to give a yellow liquid, which crystallized later. The yield was about 20 g endo 5,6-acenaphthene-norbornene.

b) Preparation of Catalyst 1

2 g of $WCl_6$ was weighed in a 100 ml dried serum cap bottle and dissolved in 40 ml of dried toluene under a dry nitrogen blanket. 1.73 ml of dried 2,6-diisopropylphenol was added slowly 100° C. The evolved HCl was collected in an excess of aqueous sodium hydroxide solution. The reaction mixture was kept for 4 hours at 100° C.

c) Copolymerization 0.08 g of catalyst 1 was dissolved in a dried mixture of 35 g of DCPD and 7 g of 5,6-acenaphtheneorbornene as obtained under a), in a 100 ml serum cap bottle. 3 ml of a 0.2 mol/l solution of tributyl tin hydride in toluene was added at ambient temperature by means of a hypodermic syringe. The bottle was shaken thoroughly and placed in an oil bath of 90° C. The reactive mix gelled very rapidly and an exothermic polymerization was observed. A maximum temperature of 200° C. after 4.5 minutes from initiation was observed.

EXAMPLE 2 a) Preparation of Catalyst 2

4 g of $WCl_6$ was weighed in a 100 ml dried serum cap bottle and dissolved in 20 ml of dried toluene under a dry nitrogen blanket. A solution of 6.6 g dried 2,6-ditertbutyl-4-methylphenol (Ionol) in 20 ml of dried toluene was added slowly at 95° C. The evolved HCl was collected in an excess of aqueous sodium hydroxide solution. The reaction mixture was kept for 4 hours at 95° C. The product was isolated by evaporation of the solvent.

b) Copolymerization 0.07 g of catalyst 2 was dissolved in a dried mixture of 35 g DCPD and 7 g of 5,6-acenaphthenenorbornene as obtained according to example 1a in a 100 ml serum cap bottle. 2.5 ml of a 0.25 mol/l tributyltinhydride solution in toluene was added at ambient temperature by means of a hypodermic syringe. The bottle was shaken thoroughly and placed in an oil bath of 90° C. An exothermic polymerization was observed for which a maximum temperature of 150° C. after 11 minutes from initiation was recorded.

EXAMPLE 3 a) Preparation of Catalyst 3

$WCl_6$ (1.73 mmol) was suspended in dried cyclopentane (5 ml) at ambient temperature under a dry nitrogen blanket. Para-trifluoromethylphenol (3.5 mmol) in cyclopentane (20 ml) was added. After completion of the reaction the catalyst was isolated by evaporation of the solvent.

b) Copolymerization

A 30 ml serum cap bottle was charged with 22 mg of the catalyst prepared in Example 3a, and a dried mixture of DCPD 10 ml and 1 g of 5,6-acenaphthenenorbornene as obtained according to example 1a, under a dry nitrogen blanket. Subsequently tributyltinhydride (80 mg) was added resulting in an exothermic polymerization. Two minutes after introduction a maximum temperature of 170° C. was reached.

EXAMPLE 4 a) Preparation of exo-1,4,4a,9,9a,10-hexahydro-9,10(1',2')-benzene-1,4-methanoanthracene (comonomer B)

An autoclave containing anthracene (8.4 g; 0.046 mol) and norbornadiene (21.6 g; 0.24 mol) in a nitrogen atmosphere, was heated at 175°–190° C. for 40 hours, after which the autoclave was cooled to room temperature and opened. Excess norbornadiene was removed under reduced pressure. The yellow solids were washed with petroleum spirit (60°–80° C.), filtrated and dried under vacuo. A yield of 12 g was obtained and the assumed structure was confirmed by PMR ($CDCl_3$).

b) A dried mixture of 10 ml DCPD and 1 g of the comonomer as prepared under a) was mixed with 20 mg of the catalyst prepared according to example 3a, under a dry nitrogen blanket. Subsequently tributyltinhydride (80 mg) was added, resulting in an exothermic polymerization. Two minutes after introduction a maximum temperature of 170° C. was reached.

EXAMPLE 5

In a 30 ml serum cap bottle, 22 mg of the catalyst obtained according to example 3a was mixed with and dissolved in a dried mixture of 10 ml DCPD and 1 g of the comonomer B as obtained according to example 4a, under a dry nitrogen blanket. Subsequently diphenylsilane (60 mg) was added. The reactive mixture was placed in an oil bath of 90° C. resulting in an exothermic polymerization. After 5 minutes a maximum temperature of 210° C. was recorded.

EXAMPLE 6

A 30 ml serum cap bottle was charged with the catalyst of example 3a (20 mg) and a dried mixture of DCPD (10 ml) and 1 g of comonomer B, as obtained according to example 4a, under a dry nitrogen blanket. Subsequently triethylsilane (0.15 ml) was added. The reactive mixture was placed in an oil bath of 90° C. resulting in an exothermic polymerization. After 5 minutes a maximum temperature of 180° C. was recorded.

EXAMPLE 7 a) Synthesis of 5,8-methylene-5a,8a-dihydrofluorene (comonomer D) in One Reactor A mixture of 58.5 ml indene (0.5 mol), 66.1 ml of dicyclopentadiene (0.5 mol) and 2 g of hydroquinone was heated during 18 hours 150° to 160° C. The reaction mixture was then cooled to ambient temperature. The reaction mixture was subsequently filtered to remove the hydroquinone. The filtrate was distilled under vacuo and the norbornene derivative was recovered as a colorless liquid at 68° C. at 1 mbar in a yield of about 60 g (66%). The obtained norbornene derivative could be identified by the following characteristic NMR signals:

PMR ($CDCl_3$):$\delta$ 0.5–4.0 ppm (8H); $\delta$ 5.6 ppm (1H); $\delta$ 5.95 ppm (1H) and $\delta$ 6.9–7.2 ppm (4H);

13CNMR($CDCl_3$): $\delta$ 34.6; $\delta$ 41.8; $\delta$ 46.6; $\delta$ 46.9; $\delta$ 50.7; $\delta$ 53.7; $\delta$ 124.1; $\delta$ 124.3; $\delta$ 125.7; $\delta$ 126.2; $\delta$ 133.0 $\delta$ 136.3; $\delta$ 145.1 and $\delta$ 145.7 ppm;

b) Copolymerization of 5,8-methylene-5a,8a-dihydrofluorene (I) with DCPD

A mixture of 10 wt % of I, as obtained under 7a, and DCPD was copolymerized, applying a DCPD-tungsten ratio between 2100 and 2400 and a tungsten-tributylhydride of 0.23–0.25.

In a 30 ml serum cap bottle 22 mg of the catalyst component 1 as obtained under example 1b) and 1.0 g of I were weighed in under nitrogen. 8 ml DCPD were added. This mixture was thoroughly homogenized. Subsequently a solution of 40 mg tributyltinhydride in 1 ml DCPD was added. After vigorous shaking, the bottle was placed in an oil bath at 90° C. An exothermic reaction took place after about 7 minutes, increasing the temperature to about 185° C. After the polymerization the obtained product was additionally cured at 90° C. for 1 hr. The obtained product showed a Tg of 131°–136° C.

EXAMPLE 8 a) Preparation of a Dinorbornyl-Benzene Monomer Mixture (Comonomer C) from DCPD and Divinylbenzene 18 ml DCPD, 1 ml of divinylbenzene and 100 mg of Irganox 1010 (registered trade mark) were heated in an autoclave for 1 hour at 180°–200° C. After cooling, the mixture was dried on molecular sieves.

b) Subsequently 9 ml of the obtained monomer mixture was copolymerized under a nitrogen atmosphere by the addition of 22 mg of the catalyst component 1 obtained according to example 1b, and 1 ml of tributyltinhydride (40 mg) solution in DCPD. The reactive mixture was placed in an oil bath of 90° C., resulting in an exothermic polymerization and after 6 minutes a maximum temperature of 185° C. was recorded. The product had a glass transition temperature of 137° C. as compared to that one of a blank experiment of 132° C.

We claim:

1. A composition of matter which can be described by a chemical structure:

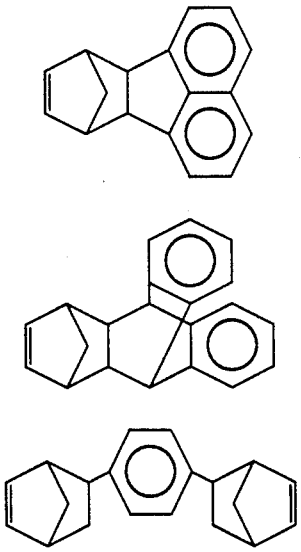

2. 5,6-acenaphthene-norbornene.
3. 1,4,4a,9,9a,10-hexahydro-9,10(1',2')benzene-1,4-methanoanthracene.
4. Dinorbornylbenzene.

* * * * *